United States Patent
Fan et al.

(10) Patent No.: US 9,793,634 B2
(45) Date of Patent: Oct. 17, 2017

(54) ELECTRICAL CONTACT ASSEMBLY FOR PRINTED CIRCUIT BOARDS

(71) Applicant: International Business Machines Corporation, Armonk, NY (US)

(72) Inventors: Na Fan, Shenzhen (CN); Jun Hu, Shenzhen (CN); Sen Xiong Huang, Shenzhen (CN); YongDong Shi, Shenzhen (CN); XiYuan Yin, Guangzhou (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/060,728

(22) Filed: Mar. 4, 2016

(65) Prior Publication Data

US 2017/0256875 A1    Sep. 7, 2017

(51) Int. Cl.
    *H01R 13/415*    (2006.01)
    *H01R 13/11*     (2006.01)
    *H01R 43/04*     (2006.01)
    *H01R 12/71*     (2011.01)

(52) U.S. Cl.
    CPC ........... *H01R 13/11* (2013.01); *H01R 12/716* (2013.01); *H01R 43/04* (2013.01)

(58) Field of Classification Search
    CPC ....... H01R 12/69; H01R 43/04; H01R 9/0771
    USPC ................................. 439/741, 743, 83, 876
    See application file for complete search history.

(56) References Cited

U.S. PATENT DOCUMENTS

| | | |
|---|---|---|
| 891,039 A | 6/1908 | Clifford |
| 2,293,606 A | 8/1942 | Kimbell |
| 2,962,692 A | 11/1960 | White |
| 3,201,744 A | 8/1965 | Dean |
| 4,262,984 A | 4/1981 | Takahashi |
| 4,645,114 A | 2/1987 | Van Den Brekel et al. |
| 4,834,681 A | 5/1989 | Chaillot |
| 4,851,614 A | 7/1989 | Duncan, Jr. |
| 4,950,186 A | 8/1990 | Kaley et al. |
| 5,284,447 A | 2/1994 | Kristiansen |
| 5,307,980 A | 5/1994 | Belanger, Jr. |
| 5,543,583 A | 8/1996 | Carson et al. |
| 5,779,502 A | 7/1998 | Daftari et al. |
| 5,984,693 A | 11/1999 | McHugh et al. |
| 6,007,365 A | 12/1999 | Atsumi et al. |

(Continued)

FOREIGN PATENT DOCUMENTS

| | | |
|---|---|---|
| CN | 1838251 B | 10/2010 |
| CN | 103155285 A | 6/2013 |

(Continued)

OTHER PUBLICATIONS

Hines et al., "Solder Charge SMT: The Design and Validation of New Solder Attach Technologies", SMTA International Conference Proceedings, Oct. 4, 2009, 7 pages.

(Continued)

*Primary Examiner* — Phuong Dinh
(74) *Attorney, Agent, or Firm* — Stephen R. Yoder

(57) ABSTRACT

A socket housing and contact assembly process includes forming the solder ball contact region after initial installation of a set of contacts into the housing. The contact regions of the set of contacts pass through corresponding contact cavities to extend beyond the housing and the contact regions are formed over at equal angles for solder ball placement.

13 Claims, 5 Drawing Sheets

(56) References Cited

U.S. PATENT DOCUMENTS

| | | | |
|---|---|---|---|
| 6,193,567 B1 * | 2/2001 | Hsieh | H01R 12/58 439/84 |
| 6,206,721 B1 | 3/2001 | Ishida | |
| 6,292,372 B1 | 9/2001 | Lin et al. | |
| 6,317,323 B1 | 11/2001 | Lee et al. | |
| 6,413,111 B1 | 7/2002 | Pickles et al. | |
| 6,422,878 B1 * | 7/2002 | Pape | H01R 12/716 439/78 |
| 6,478,588 B1 | 11/2002 | Howell et al. | |
| 6,494,748 B1 | 12/2002 | Mori et al. | |
| 6,537,097 B1 | 3/2003 | Szu | |
| 6,561,831 B1 | 5/2003 | McHugh et al. | |
| 6,740,576 B1 | 5/2004 | Lin et al. | |
| 6,752,635 B1 | 6/2004 | Searls et al. | |
| 6,821,127 B2 | 11/2004 | Lin et al. | |
| 6,905,377 B2 | 6/2005 | Murr | |
| 6,927,492 B2 | 8/2005 | Dautartas | |
| 7,037,122 B1 | 5/2006 | Chen | |
| 7,059,869 B2 | 6/2006 | Wertz et al. | |
| 7,104,827 B1 | 9/2006 | Huang | |
| 7,112,068 B2 | 9/2006 | Ma | |
| 7,578,684 B2 | 8/2009 | Liao | |
| 7,695,288 B2 | 4/2010 | Ma et al. | |
| 7,746,655 B1 | 6/2010 | Hoss et al. | |
| 7,794,236 B2 | 9/2010 | Mallik et al. | |
| 7,866,985 B2 | 1/2011 | Hsu | |
| 7,968,141 B2 | 6/2011 | Hammam | |
| 7,988,459 B2 | 8/2011 | Ulen et al. | |
| 8,167,630 B2 | 5/2012 | Lemke et al. | |
| 8,366,452 B2 * | 2/2013 | Yeh | H01R 12/55 439/66 |
| 8,461,455 B2 | 6/2013 | Kim | |
| 2002/0071935 A1 | 6/2002 | Wu | |
| 2004/0099716 A1 | 5/2004 | Yuan et al. | |
| 2004/0127085 A1 | 7/2004 | Chen et al. | |
| 2005/0042852 A1 | 2/2005 | Chou et al. | |
| 2006/0019508 A1 | 1/2006 | Lin | |
| 2007/0281507 A1 | 12/2007 | Liao et al. | |
| 2013/0059486 A1 | 3/2013 | Yang et al. | |
| 2014/0179175 A1 | 6/2014 | Pao et al. | |
| 2014/0206206 A1 | 7/2014 | Cohen et al. | |

FOREIGN PATENT DOCUMENTS

| | | |
|---|---|---|
| EP | 1416780 A2 | 5/2004 |
| EP | 1609342 B1 | 4/2012 |
| WO | 9605713 A1 | 2/1996 |
| WO | 2012050236 A1 | 4/2012 |

OTHER PUBLICATIONS

"BGA Solder Attach Update", Amphenol AHSP, Dec. 2, 2013, 6 pages.

* cited by examiner

ELECTRICAL CONTACT ASSEMBLY FOR PRINTED CIRCUIT BOARDS

BACKGROUND

The present invention relates generally to the field of electrical contacts, and more particularly to electrical contact assemblies.

A land grid array (LGA) is a type of surface-mount packaging for integrated circuits that is notable for having the pins on the socket rather than the integrated circuit. An LGA can be electrically connected to a printed circuit board either by the use of a socket or by soldering directly to the board.

A CPU (central processing unit) socket is a mechanical component that provides mechanical and electrical connections between an integrated circuit and a printed circuit board. The CPU socket allows the integrated circuit to be placed and replaced without soldering. LGA sockets are typically used for integrated circuits having a large number of pins. The LGA socket design provides for a compression force to be applied once a surface plate is in position. Thus, providing mechanical retention while avoiding the risk of bending pins when inserting the integrated circuit into the socket.

SUMMARY

An aspect of the present invention is an assembly process including inserting a socket pin into a socket housing, the socket pin having a contact region, the socket housing having a rectangular contact cavity that receive the contact region, the contact region passing through the rectangular contact cavity and extending beyond the socket housing, bending the socket pin such that the contact region is configured to receive a solder ball, and attaching the solder ball to the contact region. The bending includes securing the socket housing and striking the contact region in a first direction. The contact region is bounded by an end of the socket pin and a stress concentration feature. The socket pin bends at the stress concentration feature.

Another aspect of the present invention is a socket assembly including a plurality of socket pins, each socket pin having a first end and a second end, the first end being a first boundary of a contact region and a socket housing having a pattern of rectangular contact cavities configured to receive the contact region of a socket pin and the socket housing having a mounting side and an insertion side, the mounting side being configured for soldering to a circuit board. Each socket pin of the plurality of socket pins is installed in a respectively corresponding contact cavity of the pattern of rectangular contact cavities. The contact regions of each socket pin being formed over the standoff to create a surface for attaching a solder ball, the contact regions being substantially parallel to the mounting side of the socket housing.

DETAILED DESCRIPTION

Some embodiments of the present invention recognize the following facts, potential problems and/or potential areas for improvement with respect to the current state of the art: (i) an unresolved failure mode in the field of CPU sockets is the backing out of contacts during assembly caused by forces applied in a direction opposite the installation direction; (ii) conventional approaches provide for contact geometry to press into a pre-formed contact cavity in the socket housing; (iii) precision contact formations such as barbs and latches are stamped into the contacts, which increase design complexity and drive inefficient inspection processes and waste; (iv) conventional approaches to CPU socket design and assembly have an adverse effect on co-planarity among contacts on a single housing; (v) each contact is pressed into place, but variations in the materials and other slight variations result in uneven solder ball contact locations, which results in sunken solder balls and electrical inconsistencies; and/or (vi) damaged solder balls cause solder defects during surface mount processing.

Some embodiments of the present invention approach the problem of co-planarity by applying a final form process to the contact after installation into the socket housing.

Some embodiment of the present invention solve the problem on backed out pins by a final forming process after installation of the contact into the socket housing. As can be seen in the accompanying drawings, the final form operates to prevent the contact from backing out.

A socket housing and contact assembly process includes forming the solder ball contact region after initial installation of a set of contacts into the housing. The contact regions of the set of contacts pass through corresponding contact cavities to extend beyond the housing and the contact regions are formed over at equal angles for solder ball placement.

Figure 1:
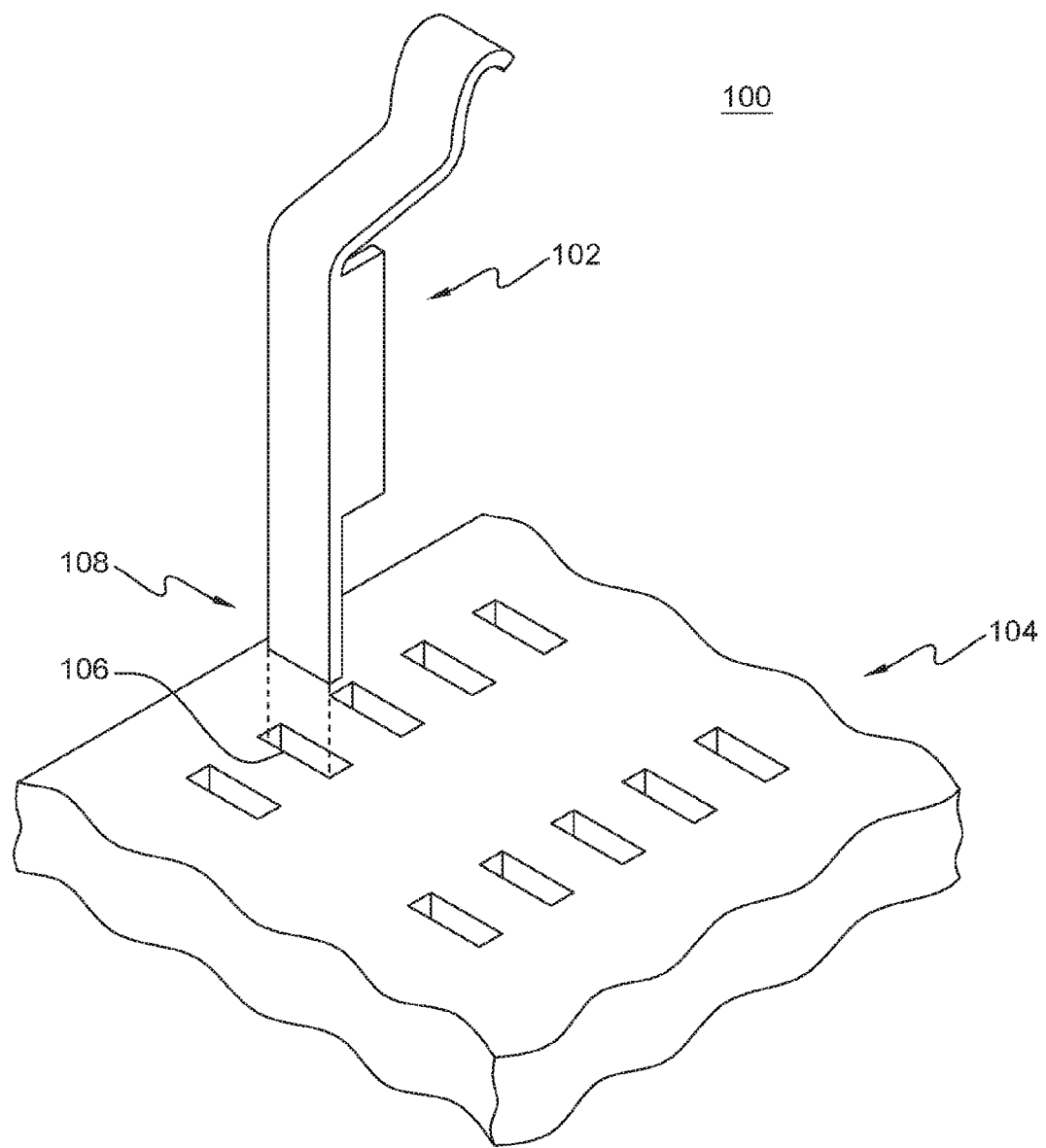
FIG. 1 is an exploded view of a socket assembly according to an embodiment of the present invention.

Referring to FIG. 1, socket assembly 100 includes socket pin 102 and housing 104. The housing and contact are illustrated in a simplified manner to emphasize aspects of the present invention for this disclosure. In one embodiment, the housing includes additional structure to support the socket pin and prevent electrical shorting, such as dielectric barriers surrounding the mid-section of the contact, additional housing elements to protect from incidental contact with the cantilever contact portion, and/or housing elements configured to receive conventional contact retention features. Further, the socket pin, in some embodiments, may include conventional retention structure(s), such as barbs and/or latches, as discussed above. However, one advantage of the present invention is that retention structures, whether on the housing or the contact, may be designed for lighter duty, that is, the retention structure may be used to hold the socket pin in place during assembly, but the fully formed socket assembly (FIG. 3) is designed to be secure against back-out forces.

Socket pin 102 includes a contact region 108. The contact region is an area on the socket pin where socket assembly 100 is attached to a solder ball (not shown). The contact region is configured to pass through contact cavity 106 and protrude away from housing 104. Further, the contact region is configured to receive the solder ball for subsequent assembly processing.

Figure 2:
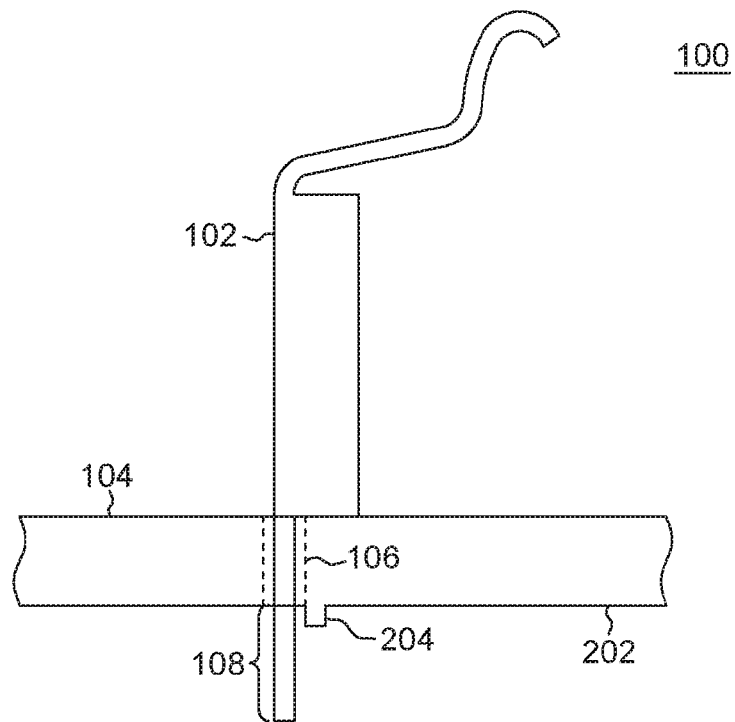
FIG. 2 is a cut-away side view of a sub-assembly of a socket assembly according to an embodiment of the present invention.

Referring now to FIG. 2, socket assembly 100 is shown with socket pin 102 inserted into housing 104. Upon inserting the socket pin into the housing, the side of housing 104 from which contact region 108 protrudes is attachment plane 202. The distance that the contact region protrudes from the housing depends largely on the application. For example, in an LGA socket assembly having a 1 mm pitch, the corresponding solder ball (not shown) is approximately 0.6 mm and the contact region is 2 mm. It should be noted that a typical LGA socket assembly includes a contact region ranging from 1 mm to 3 mm. A person of ordinary skill in the art will be able to determine an appropriate length when designing the socket assembly.

Further, the depth of contact cavity 106 is a designer's choice. It should be noted that in this example design the depth of the contact cavity and the length of contact region 108 combine to the length of the unformed pin. In some embodiments, the depth of the contact cavity corresponds also to pin features, such as retention barbs and/or latches. Assembly rib 204, also referred to as a standoff, is an additional feature of housing 104 designed to support a forming process that is discussed in the following paragraphs with respect to FIG. 3.

Figure 3:
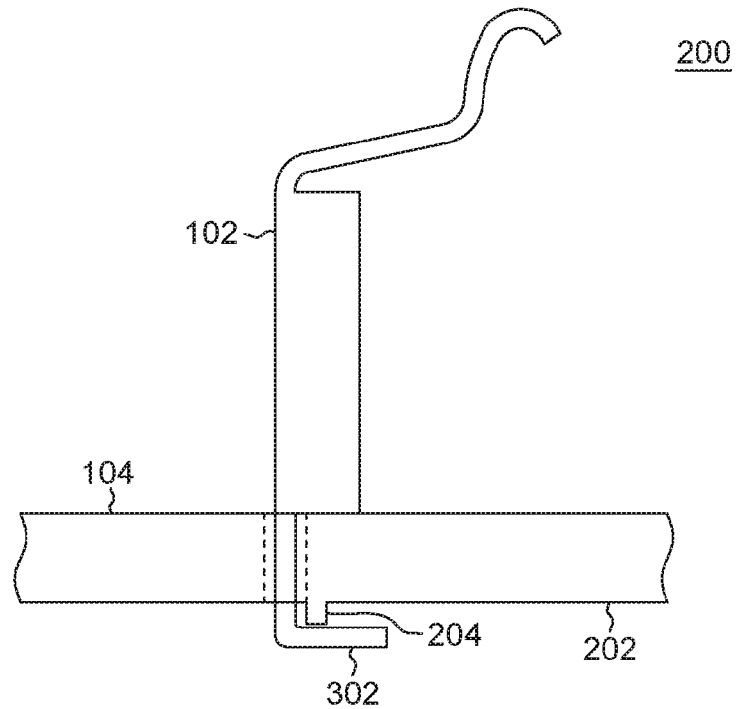
FIG. 3 is a cut-away side view of a sub-assembly of a socket assembly according to an embodiment of the present invention.

Referring now to FIG. 3, socket assembly 200 is created by bending contact region 108 of socket assembly 100. As mentioned above, conventional socket assembly processes do not form, or bend, a contact region after the socket pin is installed into the housing. In this example embodiment, the contact region is bent over to establish a surface on which a solder ball is attached. The contact cavity is configured to block and/or restrict movement of the socket pin after forming the contact region. That is, the attachment surface and/or the assembly rib prevent movement of the pin opposite the installation direction after the forming operation. Further, the simplified geometry of the contact cavity provides for a more uniform housing geometry, thus improving mold flow and reducing warpage performance over conventional socket assemblies.

While the illustration shows only one socket pin, it is expected, at least in some embodiments, that several socket pins are installed as shown in FIG. 2 and the contact regions of each of the socket pins are formed during a single process that involves mechanical rollers that strike or otherwise bend over the various contact regions. By applying the forming process to several socket pins in one forming event, the co-planarity of the various contact regions is assured. In some embodiments, a roller strikes the contact region with a single striking action to form it over toward the housing. In other embodiments, the striking action occurs in two stages, one stage to create an initial bend and a second stage to over-bend the contact to account for mechanical spring back. Particularly, where the assembly 100 is secured in a die (not shown) and a mechanical roller (not shown) bends a row of contact regions in a single motion along a planar direction.

In some embodiments, the roller moves out of plane just after passing the location of the assembly rib 204 to account for spring back of the contact regions. The assembly rib provides support for the contact region to be bent greater than 90 degrees toward the attachment plane 202. It should be understood that when a contact region is bent over during contact with a roller moving in a planar direction, subsequent to the bending operation, the contact region will spring back somewhat in the opposing direction. By moving the roller, for example, out of plane toward the attachment plane, the contact region may be precisely bent for consistent and level solder ball attachment.

In some embodiments, rigid plates strike the bent contact region by moving out of plane for the final form. The plate may be set at a desired angle to account for spring back. Further, in some embodiments, as-needed, the forming process may include repeated strikes by the rigid plates to establish the desired bend angle.

Figure 4A:
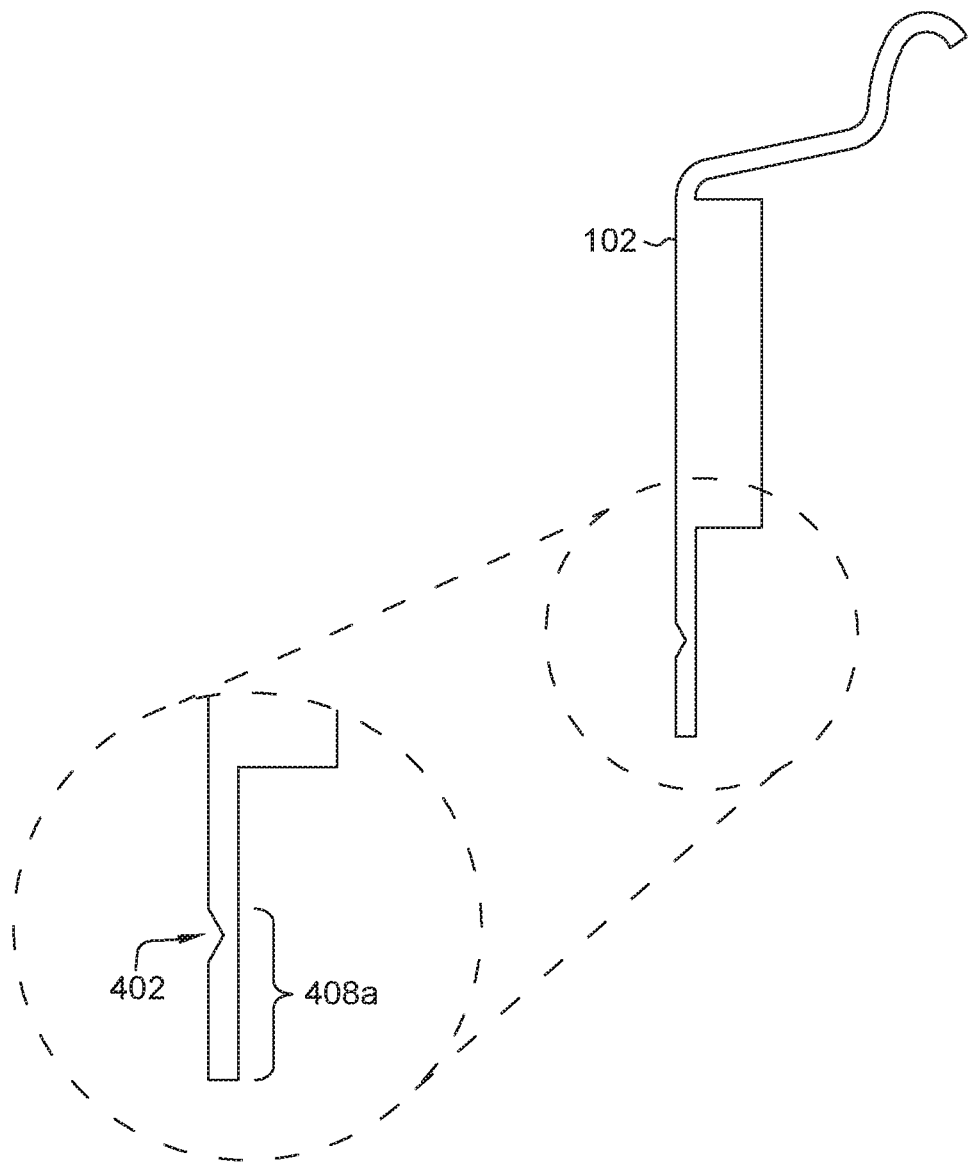
FIGS. 4A and 4B are detail views of a socket pin used in the socket assembly of FIG. 1.
Figure 4B:
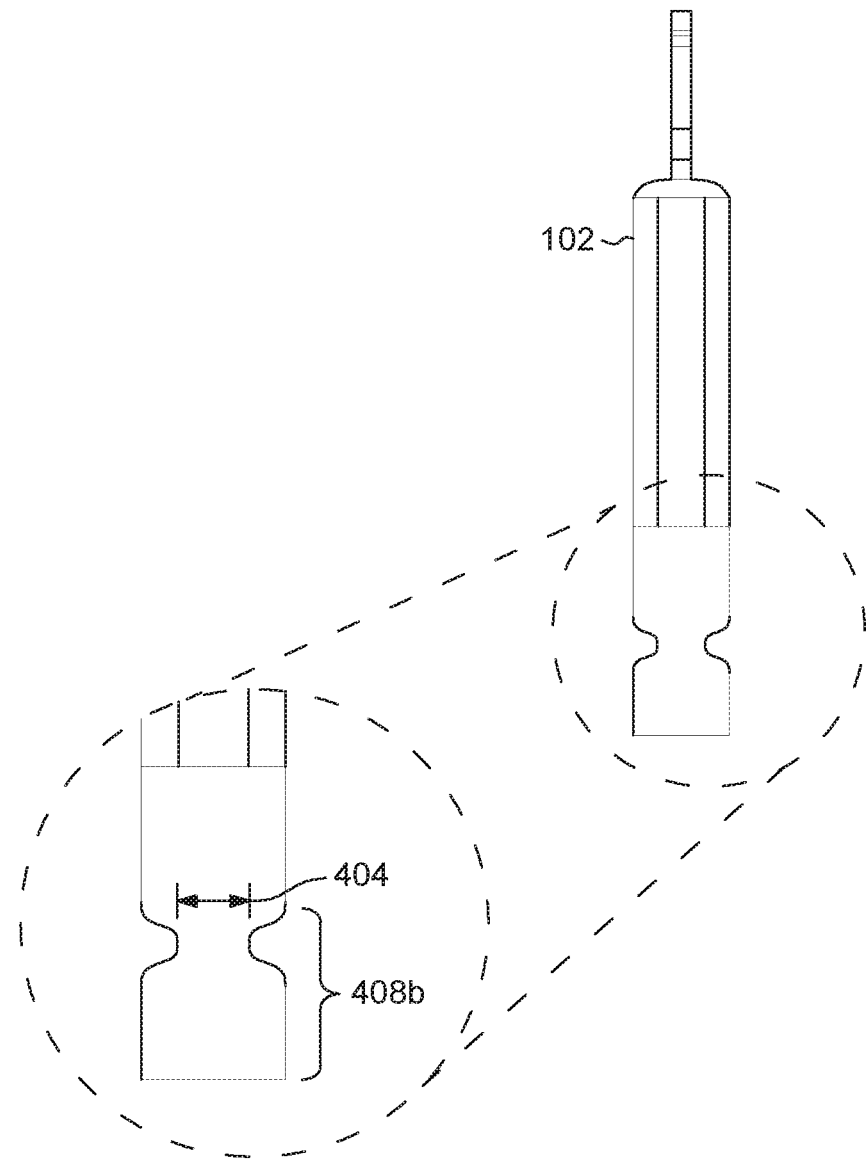

Referring now to FIGS. 4A and 4B, additional features are presented to support both consistent bending of the contact region at a desired bending point and a reduced force requirement for the bending operation. One advantage provided by additional features as shown in FIGS. 4A and 4B are the reduced spring back tendency of the contact region. The illustrated features are different solutions drawing from the principle of stress concentration. By creating a stress concentration at a particular location on the contact, when a bending for is applied near the contact region, a failure will occur first at that location.

FIG. 4A is a side view of contact region 408a having notch 402, or scoreline, located at a desired bend location. Effectively, contact region 408a is located below the notch. When bending force is applied, whether by roller as described above, or by other application of force, contact region 408a is bent over such that it remains approximately 90 degrees from its original orientation.

FIG. 4B is a front view of contact region 408b having a reduced width 404 that creates a region of less resistance to bending. Upon application of a bending force, as discussed above, contact region 408b, defined at one end by the reduced width, bends over such that it remains approximately 90 degrees from its original orientation.

Figure 5:
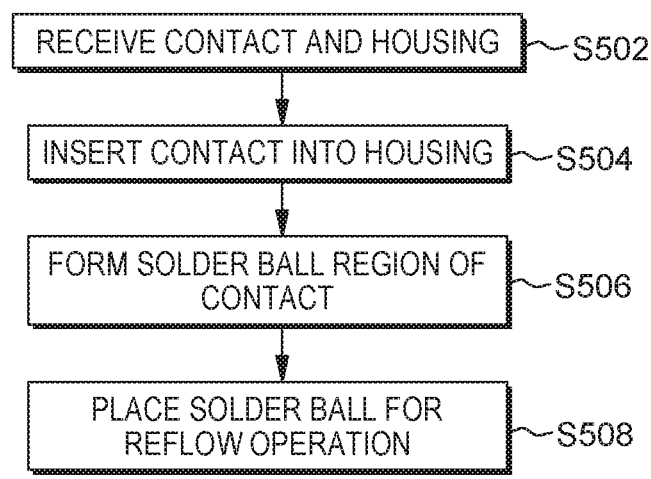
FIG. 5 is a flowchart depicting an assembly process according to an embodiment of the present invention.

FIG. 5 is flowchart 500 for creating socket assembly 200 as shown in part at FIG. 3.

Processing begins at step S502, where a set of socket pins are received along with a socket housing suitable for the installation of the socket pins. The socket pins are fully stamped and/or formed with the exception of a final bend to be made at a later step during the assembly process (FIG. 1). The socket pins include a contact region, such as region 108, and the socket housing includes a contact cavity, such as contact cavity 106.

Processing proceeds to step S504, where the set of socket pins are inserted into the housing as shown in part at FIG. 2. In one embodiment, the housing is configured to hold the socket pin in place, at least with sufficient resistance to movement to support bending the contact region. This resistance to movement includes resistance to backout forces and angular forces generated during the bending process. Resistance to movement during use of the socket is conventionally achieved with features such as barbs and/or latches on the socket pin that interact with the housing to secure the socket pin with respect to the housing. While the resistance to movement during bending is lower than in conventional designs where backout forces must be resisted during use, conventional barbs and/or latches may be used while practicing embodiments of the present invention. Resistance to angular movement is achieved with conventional housing geometry supporting the socket pin along the length of the pin.

Processing proceeds to step S506, where the contact regions, extending below attachment surface 202 (FIG. 2) are formed over such that they are oriented for the attachment of solder balls, one per contact region. By introducing a forming stage at this step, the housing is advantageously designed with relatively simple rectangular through-hole cavities. Alternative geometries are envisioned, but not illustrated herein. One advantage that may be found in this design is the uniform wall thickness from one cavity length to a next cavity length. Additionally, the gap between cavity lengths may be designed to be equivalent to the thickness of the cavities. These changes are improvements that improve mold flow characteristics during the plastic molding process.

Processing ends at step S508, where solder balls are placed on the various contact regions. As discussed above, the contact regions are generally parallel with attachment plane 202 and are generally co-planar with one another where the bending process assures uniform application of bending force. In practice, the socket assemblies, having installed solder balls, are ready for an infrared reflow process used during subsequent installation of the socket assemblies. While the examples provided show a 90 degree bend and discuss parallel configuration with respect to the attachment plane, the application of bending a contact region post-assembly may be applied to various shapes and directions.

Some embodiments of the present invention may include one, or more, of the following features, characteristics and/or advantages: improved dynamic warpage performance; and relatively low housing mold tooling cost compared to conventional mold tooling.

Some embodiments of the present invention are useful in CPU socket design where solder balls are attached to a contact surface. Technical problems that arise in CPU socket manufacturing include: damaged solder balls; solder ball co-planarity; and warpage of socket housing during surface mount processing.

As described above, a contact forming process includes post assembly forming. By forming the contact after assembly, the housing geometry is simplified, as shown, for example, in contact cavity 106 (FIG. 1) as a rectangular shape. The simplified geometry may include fewer cored out features in the molded part than is required when installing the fully-formed contact.

What is claimed is:

1. An assembly process comprising:
    inserting a socket pin into a socket housing, the socket pin having a contact region, the socket housing having a rectangular contact cavity that receive the contact region, the contact region passing through the rectangular contact cavity and extending beyond the socket housing;
    bending the socket pin such that the contact region is configured to receive a solder ball including:
        securing the socket housing, and
        striking the contact region in a first direction,
    wherein:
        the contact region is bounded by an end of the socket pin and a stress concentration feature, and
        the socket pin bends at the stress concentration feature; and
    attaching the solder ball to the contact region;
    wherein the socket housing includes a standoff located on the side of the socket housing where the contact region of the socket pin extends out and located on the side of the rectangular contact cavity where the socket pin is bent.

2. The assembly process of claim 1, further comprising:
    striking the contact region a second direction such that the contact region is bent more than 90 degrees from an original orientation.

3. The assembly process of claim 2, wherein striking the contact region the second direction causes the socket pin to contact a standoff of the socket housing.

4. The assembly process of claim 1, wherein the socket pin is a central processing unit (CPU) socket pin.

5. The assembly process of claim 4, wherein the socket pin is an land grid array (LGA) socket pin.

6. The assembly process of claim 1, wherein the stress concentration feature has a smaller width than the contact region.

7. The assembly process of claim 1, wherein the stress concentration feature is a scoreline.

8. A socket assembly comprising:
    a plurality of socket pins, each socket pin having a first end and a second end, the first end being a first boundary of a contact region; and
    a socket housing having a pattern of rectangular contact cavities configured to receive the contact region of a socket pin, the socket housing having a mounting side and an insertion side, the mounting side being configured for soldering to a circuit board;
    wherein:
    each socket pin of the plurality of socket pins is installed in a respectively corresponding contact cavity of the pattern of rectangular contact cavities; and
    the contact regions of each socket pin being formed over a standoff to create a surface for attaching a solder ball, the contact regions being substantially parallel to the mounting side of the socket housing.

9. The socket assembly of claim 8, wherein the socket pin has a stress concentration feature that is a second boundary of the contact region.

10. The assembly process of claim 9, wherein the stress concentration feature has a smaller width than the contact region.

11. The assembly process of claim 9, wherein the stress concentration feature is a scoreline.

12. The assembly process of claim 8, wherein the plurality of socket pins is a plurality of central processing unit (CPU) socket pin.

13. The assembly process of claim 8, wherein the plurality of socket pins is a plurality of land grid array (LGA) socket pins.

* * * * *